(12) United States Patent
Yoo

(10) Patent No.: US 6,500,264 B2
(45) Date of Patent: Dec. 31, 2002

(54) CONTINUOUS THERMAL EVAPORATION SYSTEM

(75) Inventor: Woo Sik Yoo, Palo Alto, CA (US)

(73) Assignee: WaferMasters, Inc., San Jose, CA (US)

(*) Notice: Subject to any disclaimer, the term of this patent is extended or adjusted under 35 U.S.C. 154(b) by 0 days.

(21) Appl. No.: 09/828,654

(22) Filed: Apr. 6, 2001

(65) Prior Publication Data
US 2002/0144904 A1 Oct. 10, 2002

(51) Int. Cl.[7] .................. C23C 16/00; C23C 14/34; C23C 14/35; B05D 3/04
(52) U.S. Cl. .................. 118/719; 118/723 EB; 204/192.12; 204/298.07; 204/298.16; 204/298.25; 427/294
(58) Field of Search .................. 427/585, 294; 204/192.12, 192.11, 298.04, 298.07, 298.16, 298.23, 298.25; 118/719, 723 EB, 50

(56) References Cited

U.S. PATENT DOCUMENTS

| 4,274,936 A | | 6/1981 | Love .................. 204/192 R |
| 4,636,401 A | * | 1/1987 | Yamazaki et al. .................. 427/39 |
| 4,882,198 A | | 11/1989 | Temple et al. .................. 427/38 |
| 5,178,739 A | * | 1/1993 | Barnes et al. .................. 204/192.12 |
| 5,651,868 A | * | 7/1997 | Canady et al. .................. 204/298.25 |
| 6,012,413 A | | 1/2000 | Tsujimoto et al. .................. 118/723 EB |

OTHER PUBLICATIONS

"Vacuum Deposition System," *Semiconductor International*, May 2000, p. 116.
Kurt J. Lester Company, pp. 2–63 through 2–74.
Kurt J. Lester Company, pp. 17–1 through 17–4.

* cited by examiner

Primary Examiner—Steven H. VerSteeg
(74) Attorney, Agent, or Firm—MacPherson Kwok Chen & Heid LLP

(57) ABSTRACT

A processing system and associated method for vacuum evaporation of material onto a substrate. The processing system includes a loading chamber, a transfer chamber, and a thermal processing chamber arranged together to form a cluster tool. The cluster tool arrangement provides the system a continuous processing capability. The system also includes an evacuation system arrangement for evacuating the processing system to adequate processing pressure levels. The evacuation system arrangement includes a series of pumps, which are capable of maintaining the selected processing pressure levels for continuous thermal evaporation processing without the need for lowering the pressure to deep vacuum pressure levels.

21 Claims, 3 Drawing Sheets

CONTINUOUS THERMAL EVAPORATION SYSTEM

BACKGROUND OF THE INVENTION

1. Field of the Invention

The invention relates to vacuum deposition, and more particularly to a system and method for vacuum deposition in a cluster tool.

2. Description of the Related Art

Vacuum evaporation systems are well known in the art. FIG. 1A illustrates a typical vacuum evaporations system 10, which has magnetron sputtering and/or electron beam gun deposition capabilities. Magnetron sputtering and electron beam gun deposition are well established technologies for the coating of objects, such as semiconductor substrates. For example, sputtering is accomplished by bombardment with high-energy ions, usually ions of the rare gas argon (sputter gas), which is initiated by gas discharge processes. The ions of the sputter gas are subjected to controlled acceleration in the direction of the target at high kinetic energies, such that individual atoms can be knocked out of the target.

As illustrated in FIG. 1A, vacuum deposition system 10 includes a single closed chamber 12 operatively coupled to a roughing pump (not shown) and a diffusion type pump (not shown) through a series of valves 18a–18d. The sputter process is typically carried out in closed chamber 12 under conditions of deep vacuum pressures to ensure a long to mean free path length of the vapor particles (i.e., sputtered particles) as possible.

FIG. 1B illustrates a representative Pressure-Time profile for system 10. As shown, valves 18a–18d are closed to maintain the pressure in chamber 12 initially at atmospheric pressure. Valve 18a is opened to allow the roughing pump to lower the pressure in chamber 12 to a first pressure $P_0$. Once the pressure is lowered to a level where the roughing pump is no longer effective, valve 18a is closed while valves 18b and 18c are opened to allow the diffusion pump to evacuate chamber 12 down to deep vacuum pressure $P_1$. Since in most evaporation processes the process is not controlled, the deep vacuum pressure supplied by the diffusion pump is necessary to compensate for the increase in pressure that occurs at time $T_3$, when the evaporation process begins. Also, since the mean free path of the sputtered particles is longest at pressures below pressure $P_0$, the deep pressure is necessary to increases the length of time that the sputtered particles can be effectively deposited.

Unfortunately, because of the rapid increase in pressure during the evaporation process, the mean free path of the sputtered particles is changing from long to short very quickly, which can create a relatively non-uniform deposition. Another drawback of vacuum deposition system 10 is the inefficient use of the vacuum pumps. For example, the roughing vacuum pump is effective to evacuate chamber 12 up to pressure levels of from 0.7 Torr–0.5 Torr. At pressure levels of 0.7 Torr–0.5 Torr the efficiency of the mechanical pump is reduced dramatically because the movement of the remaining atmosphere in chamber 12 begins to take on molecular flow characteristics. This results in a substantial reduction in pumping speed as chamber 12 continues to be evacuated to about 0.2 Torr. The diffusion pump can then be used to further evacuate chamber 12 to the desired deep vacuum pressure levels. Unfortunately, since diffusion pumps, such as oil diffusion pumps, are ineffective when operated at pressures over 0.2 Torr microns, chamber 12 has had to be mechanically evacuated to the effective operating range of the diffusion pumps. The time taken to reduce the pressure in chamber 12 from 0.5 Torr–0.2 Torr can be significant and can reduces production rates appreciably. In addition, once the evaporation process has begun, the pressure in chamber 12 rises significantly, which is usually above the operating range of the diffusion pump. This prevents the ability to continuously process substitutes.

In addition to the length of time required to evacuate chamber 12 to its effective operating levels, chamber 12 is opened to atmosphere between operations. The evacuation time is further extended since water and oxygen molecules, as well as other contaminants, are introduced into chamber 12. The presence of these contaminants can adversely effect the quality of the thin film layers. Purging chamber 12 of such molecules is possible, however, this further extends the production time.

What is needed is a vacuum deposition system that provides a continuous processing capability, reduces processing cycle times, and increases throughput per cycle.

SUMMARY OF THE INVENTION

The present invention provides a processing system and associated method for vacuum evaporation of material onto a substrate. In accordance with the present invention, the system includes an evacuation system arrangement for evacuating the processing system to adequate processing pressure levels. Advantageously, the evacuation system arrangement includes pumps, which are capable of substantially maintaining the processing pressure levels for continuous thermal evaporation processing without the need for lowering the pressure to deep vacuum pressure levels. The processing system further includes a loading chamber, a transfer chamber, and a thermal evaporation processing chamber arranged together to form a cluster tool. The cluster tool arrangement provides the system a continuous processing capability.

In one aspect of the present invention, a system is provided for vacuum depositing a thin film on a semiconductor substrate. The system includes a wafer processing chamber for receiving a substrate. The wafer processing chamber defines a transfer section and a processing section. The transfer section provides the system with the capability to insert and remove substrates on a continuous cycle. The processing section provides the system with a thermal evaporation processing capability in which the thin film is deposited on the substrate. A first evacuation device is provided in the system for evacuating the wafer processing chamber to an operating pressure. A second evacuation device is also provided for evacuating the wafer processing chamber to sustain the operating pressure throughout the wafer processing cycle. Once the processing of the substrate has occurred, the substrate can be transported between the transfer section and the processing section while the chamber is maintained at or near the operating pressure.

In another aspect of the present invention, a method is provided for vacuum depositing a thin film on a substrate. The method includes providing a wafer processing chamber for receiving a substrate. The chamber is substantially and continuously evacuated to sustain a selected operating pressure level during a thermal evaporation process, which may be conducted in the wafer processing chamber.

The present invention has many advantages over typical vacuum deposition systems and methods. For example, sputtered particles that emanate from the evaporated material during the evaporation process have a more average and consistent mean free path. Thus, the sputtered particles can be more uniformly deposited on the wafer. Because the present invention does not require deep vacuum pressure levels, the process chamber structure can be made smaller and more economically. By avoiding the need for deep vacuum pressures, the system of the present invention can be arranged in conjunction with a loading station and a transfer station to provide continuous cycling of substrates within a closed vacuum environment. Thus, exposure of the substrates to contamination is minimized and processing cycle times are reduced. The time needed to reduce the chamber pressure to deep vacuum levels and the need to backfill the chamber between processing cycles is removed, thus throughput of processed substrates can be increased.

These and other features and advantages of the present invention will be more readily apparent from the detailed description of the embodiments set forth below taken in conjunction with the accompanying drawings.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments of the present invention will be described with reference to the aforementioned figures. These figures have been simplified for ease of describing and understanding the embodiments.

Figure 1A:
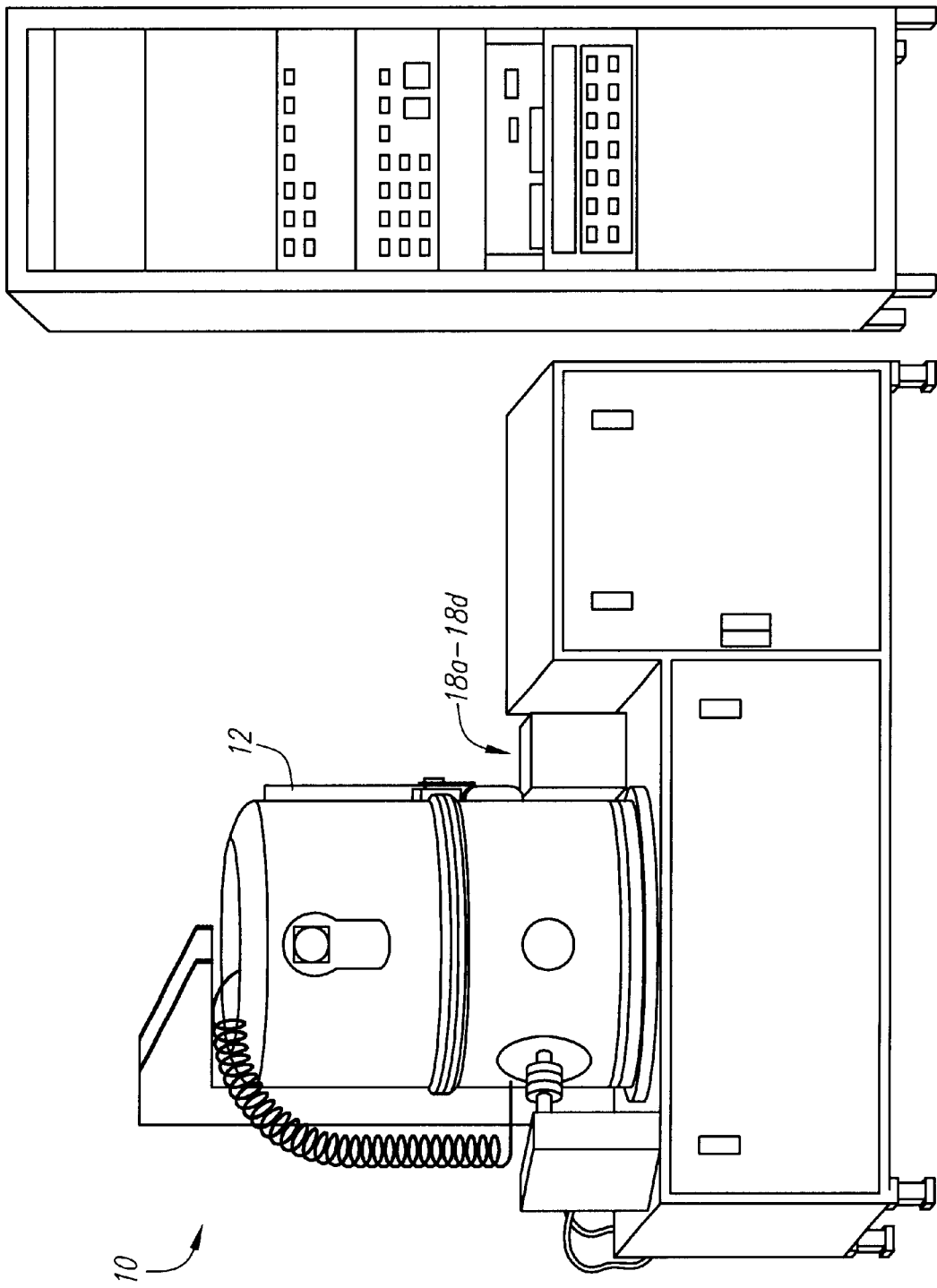
FIG. 1A shows a typical vacuum deposition system.
Figure 1B:
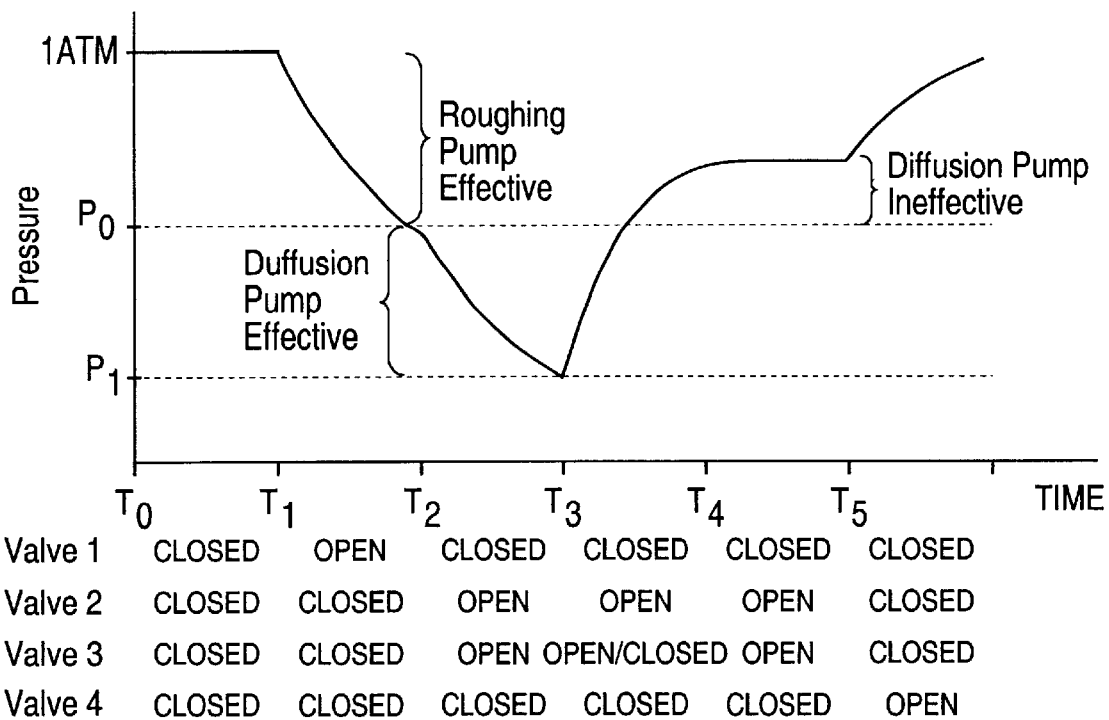
FIG. 1B is a representative Pressure-Time profile for the system of FIG. 1A.
Figure 2:
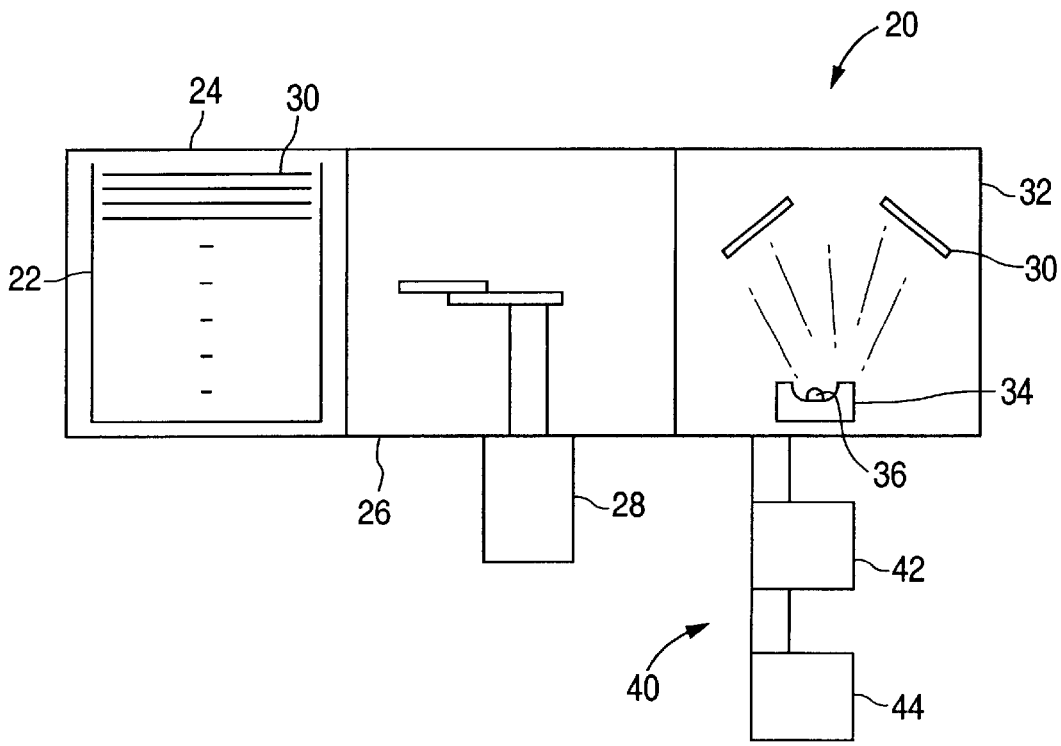
FIG. 2 is a simplified schematic illustration of an embodiment of the wafer processing system in accordance with the present invention

FIG. 2 is a simplified schematic illustration of one embodiment of a semiconductor wafer processing system 20 that establishes a representative environment of the present invention. Processing system 20 can include a loading station, which can have multiple platforms (not shown) for supporting and moving a wafer cassette 22 up and into a loadlock or loading chamber 24. Wafer cassette 22 may be a removable cassette which is loaded onto the platform, either manually or with automated guided vehicles (AGV). Wafer cassette 22 may also be a fixed cassette, in which case wafers are loaded onto cassette 22 using conventional atmospheric robots or loaders (not shown). Once wafer cassette 22 is inside loading chamber 24, loading chamber 24 and transfer chamber 26 can be pumped down to a vacuum pressure. A robot 28 housed within transfer chamber 26 can rotate toward loading chamber 24 and pick up a wafer 30 from cassette 22. A thermal processing chamber 32, which can also be under vacuum pressure, accepts wafer 30 from robot 28 through a gate valve. Robot 28 then retracts and, subsequently, the gate valve closes to begin the processing of wafer 30. After wafer 30 is processed, the gate valve opens to allow robot 28 to pick-up and place wafer 30 into a cooling station (not shown). The cooling station cools the newly processed wafers before they are placed back into wafer cassette 22.

In one embodiment, thermal processing chamber 32 has a thermal evaporation capability, such as magnetron sputtering and/or electron beam source deposition capabilities. As shown in FIG. 2, a conductive source material holder 34, such as a conductive crucible, is positioned within chamber 32. Crucible 34 carries a preselected material 36 for thermal evaporation onto substrates 30, which are typically positioned within chamber 32 on a substrate holder (not shown). Preselected material 36 may include, but is not limited to, metals, such as Al, Au, Ni, Cu, Ag, Ti, Ta and the like; alloys, such as AlSi, TiSi, and the like; and insulators, such as indium tin oxide (ITO).

When conducting an electron beam source deposition, for example, a high voltage electron beam source (not shown) can be positioned within chamber 32 proximate to crucible 34. In one configuration, the electron beam source includes a high voltage electron gun and a deflection magnet system arranged for bending electrons from the gun into crucible 34 for evaporating preselected material 36. The magnet system forms a magnetic field in the region above crucible 34 to guide the high voltage electron beam into crucible 34 to cause material 36 to evaporate.

In some embodiments, a reactive process gas, such as $NH_3$, $O_2$, and $H_2$, may be introduced into chamber 32 during processing at any convenient position relative to crucible 34 and the electron beam source. In the case in which the activation gas is reactive with the evaporant material 36, the deposited thin film can have constituents of both the evaporant material 36 and the reactive process gas. In one example, Ta from a solid can be combined with $O_2$ to from a $Ta_2O_5$ Layer. In another example CuO or $CuO_2$ can be combined with $H_2$ to yield a Cu layer. In another embodiment, the reactive gas may be introduced into chamber 32 to prevent oxidation of evaporate material 36. For example, Cu is placed in crucible 34 and evaporated, $H_2$ is introduced into chamber 32 to react with the Cu to prevent the unwanted oxidation. Various types of electron beam source assemblies are disclosed in U.S. Pat. Nos. 4,882,198, and 6,012,413, which are herein incorporated by reference in their entirety for all purposes.

Figure 3:
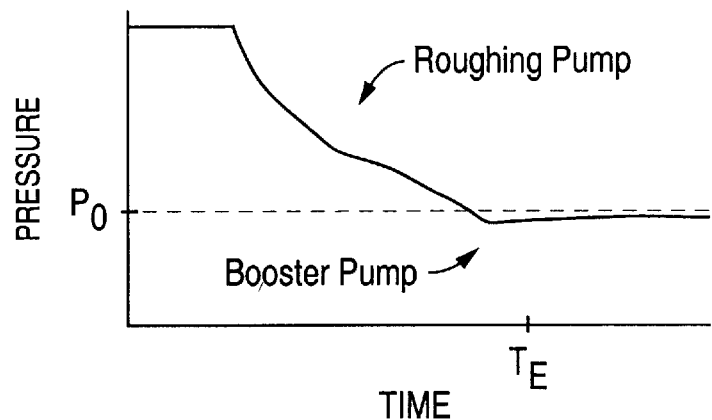
FIG. 3 is a representative Pressure-Time profile in accordance with the present invention.

As shown in FIG. 2, processing chamber 32 is coupled to an evacuation system 40. Evacuation system 40 is used to reduce the internal pressure of chamber 32 to a level in which efficient deposition, such as magnetron sputtering or electron beam source deposition, can occur. In accordance with the present invention, pressure levels of below about 0.5 Torr are not necessarily required, thus a diffusion type pump is not needed. In one embodiment, evacuation system 40 can provide the Pressure-Time profile depicted in the representative graph of FIG. 3. Evacuation system 40 can initially lower the chamber pressure level to a level at or near the desired operating pressure $P_O$. The operating pressure $P_O$ of processing system 20 may range from about $10^{-3}$ to about $10^{-6}$ Torr. Once at the operating pressure $P_O$, evacuation system 40 can maintain and sustain $P_O$ during the material evaporation process. To sustain the operating pressure $P_O$ the pumping speed of evacuation system 40 is such that it is greater than the speed of the pressure change caused by the evaporation. As best illustrated in FIG. 3, the increase in pressure caused by the evaporation process only slightly rises above the operating pressure, such that the operating pressure is considered to be substantially maintained. For example, the pumping speed of the evacuation system during processing can range from between 1000 Torr l/min and 50000 Torr l/min.

One result of substantially maintaining the operating pressure during the evaporation process is that a more average mean free path is provided for the particles to travel before being deposited on the substrate. The average mean free path can be obtained and sustained at higher pressures, as well. These results allow for more uniform and consistent layers being deposited on the substrates.

Evacuation system 40 allows process chamber 32 to be used in conjunction with transfer chamber 26 and loading station 24 to form a "cluster tool." In a cluster tool, the three chambers 26, 24, and 32 are arranged such that they are in gaseous communication with each other chamber. Thus, a substrate or plurality of substrates can be cycled through system 20 without having to be exposed to the external environment or to atmospheric pressure. Accordingly, system 20 can be used in a continuos operational mode, since the evacuation system 40 can maintain the $P_0$ at all times during and in between processes and because the system does not require deep vacuum pressures levels.

Evacuation system 40 can include pumps, for example, a roughing pump 42 and a mechanical booster pump 44, and associated pumping components (not shown), such as a pumping manifold for communicating chambers 24, 26, and 32 to an inlet of roughing pump 42, isolation or gate valves, and vent valves for venting to atmospheric pressure as required.

In one embodiment, roughing pump 42 can be used to evacuate system 20, including loading chamber 24, transfer chamber 26 and processing chamber 32 (collectively the "system chamber"). In this embodiment, roughing pump 42 can be an electric motor driven reciprocating piston, compressor type pump, which is particularly efficient for pumping a gas at above absolute pressures of about 0.5 Torr. Roughing pump 42 should be capable of providing a pumping flow rate of about 1000 Torr l/min to about 50000 Torr l/min. In operation, the actual pumping flow rate is diminished as the pump 42 evacuates chambers 24, 26, and 32 and when the gas density is reduced to a level where its flow can be characterized as molecular flow, or molecular in nature (generally below 0.5 Torr). An example of a suitable roughing pump for use in the present invention is available from Kashiyama Industries Ltd. of Tokyo, Japan.

Roughing pump 42 is coupled in series to mechanical booster pump 44. Booster pump 44 may be any pump that can provide a high pumping speed with a low base pressure. The low base pressure may range from about $10^{-7}$ to about $10^{-10}$ Torr. The actual pumping rate can be determined by the application. For example, booster pump 44 may be a turbo pump or similar type pump, such as TMO1000L available from Leybold Vacuum.

Figure 4:
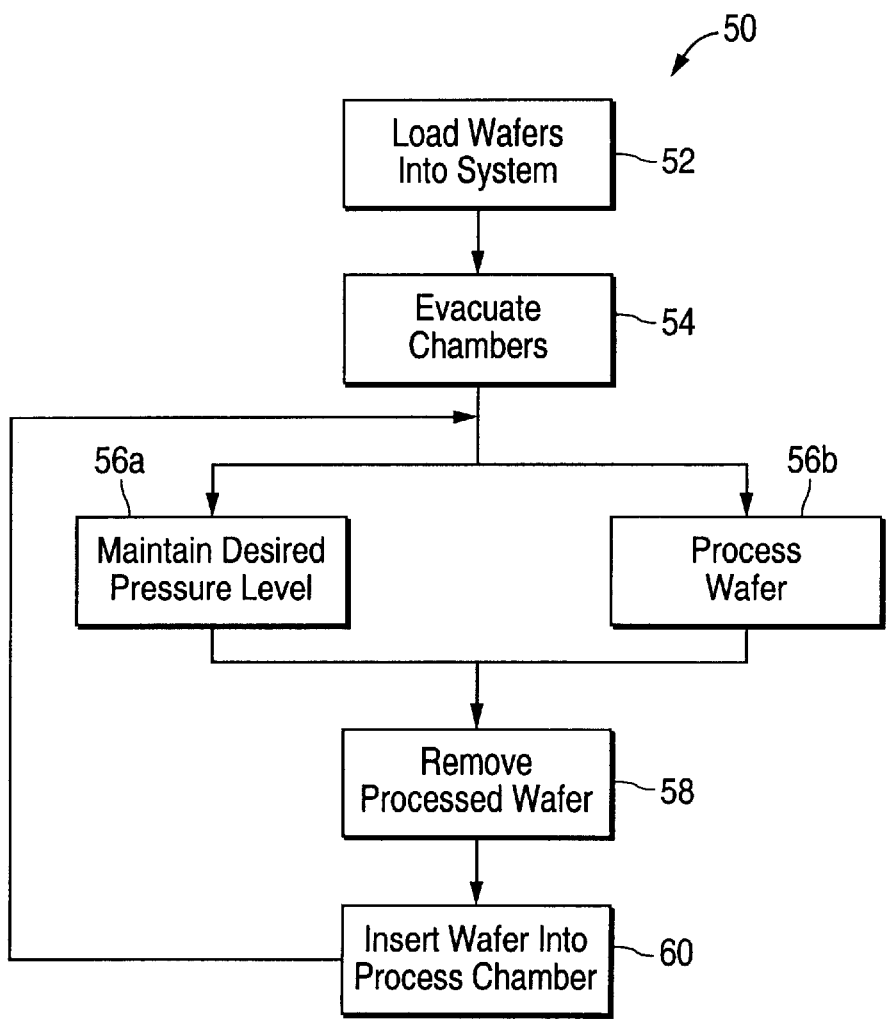
FIG. 4 is a flow chart representing embodiment of the present invention.

FIG. 4 is a flow chart which describes an operational method 50 in accordance with the present invention. In this method 50, a wafer platform loads 52 a wafer cassette carrying multiple wafers into the loading chamber. Once the wafer cassette is inside the loading chamber, the loading chamber, transfer chamber, and processing chamber can be pumped down 54 to a selected vacuum pressure. The vacuum pressure can be at or near a desired operating pressure as determined by the application. A mechanical roughing pump can be used to achieve the desired pressure level. In one embodiment, the roughing pump lowers the pressure level of the entire system down to a pressure level ranging from about $10^{-2}$ Torr to about $10^{-4}$ Torr.

A robot being housed within the transfer chamber rotates toward the loading chamber to pick up and translate a wafer from the loading chamber to the thermal processing chamber. The thermal processing chamber accepts the wafer from the robot through a gate valve. The robot then retracts and, subsequently, the gate valve closes to begin the processing of the wafer. In one embodiment, the wafer processing can include a thermal evaporation process, such as a sputtering deposition or an electron beam source deposition. It is known that thermal evaporation processes that occur in a closed system tend to increase the internal pressure of the system. The increased pressure may increase the pressure level above the selected operation pressure levels. Thus, a booster pump, can be used to maintain the operating pressure level 56a during the thermal evaporation processing 56b of the wafer.

After the wafer is processed, the gate valve opens to allow the robot to pick-up and place the wafer into an alternate location in the system 58, for example, into a cooling station. The cooling station cools the newly processed wafers before they are placed back into the wafer cassette. The robot then picks up and places a different wafer into the processing chamber 60 to begin the processing again.

At all times after the chambers have been pumped down to operating pressure, the roughing pump and turbo pump continue to substantially maintain the operating pressure level.

While the principles of the invention have been described in connection with certain embodiments, it is to be understood that this description is not a limitation on the scope of the invention.

What is claimed is:

1. A vacuum deposition system for depositing a thin film on a substrate, the system comprising:
   a wafer processing chamber for receiving a substrate, including a transfer section and a processing section;
   a thermal evaporation processing assembly disposed in said processing section; and
   an evacuation apparatus in communication with said wafer processing chamber configured for continuously evacuating said wafer processing chamber to sustain an operating pressure, said evacuation apparatus including,
      a first evacuation means for evacuating said processing chamber to a first pressure, said first pressure being at or substantially near said operating pressure; and
      a second evacuation means for sustaining said first pressure at or substantially near said operating pressure as said thermal evaporation processing assembly operates.

2. The system of claim 1, wherein said substrate is transportable within said vacuum deposition system while said vacuum deposition system is being maintained at said operating pressure.

3. The system of claim 1, wherein said transfer section is capable of continuously transferring substrates between said processing section and an alternative location within said vacuum deposition system while said wafer processing chamber remains at said operating pressure.

4. The system of claim 1, wherein said wafer processing chamber further comprises a substrate loading section.

5. The system of claim 1, wherein said thermal evaporation processing assembly provides structure to perform a magnetron sputtering process or an electron beam gun deposition process.

6. The system of claim 1, wherein said first evacuation means comprises a roughing pump having a base pressure of between about $10^{-3}$ to about $10^{-5}$ Torr.

7. The system of claim 1, wherein said second evacuation means comprises a turbo pump having a base pressure of about $10^{-7}$ to about $10^{-10}$ Torr.

8. The system of claim 1, wherein said transfer section defines a transfer chamber including a robot, and wherein said processing section defines a substrate processing chamber, said transfer chamber and said processing chamber being coupled together in communication with each other.

9. The system of claim 1, wherein said evacuation apparatus has an evacuation rate of between about 1000 and 50000 Torr l/min.

10. The system of claim 1, wherein said first evacuation means comprises a roughing pump and said second evacuation means comprises a turbo pump, said roughing pump being in series with said turbo pump, said evacuation apparatus maintaining a continuous operating pressure within said process chamber.

11. The system of claim 10, wherein said continuous operating pressure is maintained at between about $10^{-2}$ and $10^{-7}$ Torr by said evacuation apparatus.

12. A method for vacuum depositing a thin film on a substrate, the method comprising:

providing a wafer processing chamber for receiving a substrate; and substantially and continuously evacuating said wafer processing chamber to maintain a selected operating pressure level during a thermal evaporation process being conducted in said wafer processing chamber, said evacuating including evacuating said wafer processing chamber with a first evacuation device to a first pressure level, said first pressure level being at or substantially near said operating pressure level, and further evacuating said wafer processing chamber with a second evacuation device to sustain said first pressure level at said operating pressure level.

13. The method of claim 12, wherein said thermal evaporation process comprises a sputtering process or an electron beam source deposition process.

14. A method comprising:

providing a process chamber including a thermal evaporation assembly;

evacuating said process chamber to a processing pressure, using a first evacuation device;

inserting a first substrate into said process chamber;

conducting a first thermal evaporation process with said thermal evaporation assembly;

removing said first substrate from said process chamber, and inserting a second substrate into said process chamber; thereafter conducting a second thermal evaporation process with said thermal evaporation assembly; and substantially maintaining said processing pressure using a second evacuation device during each of said inserting, removing, and conducting.

15. A method for depositing a thin film on a substrate comprising:

providing a process chamber including a thermal evaporation assembly;

evacuating said process chamber with a first evacuation device to a first processing pressure; and substantially maintaining said first processing pressure with a second evacuation device at or near said first processing pressure during a plurality of thermal evaporation processes conducted with said thermal evaporation assembly.

16. The method of claim 15, further comprising continuously removing and inserting substrates from said process chamber between said thermal evaporation processes while said process chamber is at or near said first processing pressure.

17. The method of claim 15, wherein said thermal evaporation processes comprise a magnetron sputtering process or an electron beam source deposition process.

18. The method of claim 15, wherein said evacuating sustains said operating pressure between about $10^{-2}$ Torr and $10^{-7}$ Torr.

19. A method for depositing a thin film on a substrate comprising:

providing a process chamber including a thermal evaporation assembly;

evacuating said process chamber to a first processing pressure; and substantially maintaining said first processing pressure during a plurality of thermal evaporation processes conducted with said thermal evaporation assembly, said evacuating conducted using a roughing pump having a base pressure of between about $10^{-3}$ to about $10^{-5}$ Torr and a booster pump having a base pressure of about $10^{-7}$ to about $10^{-10}$ Torr.

20. The method of claim 19, further comprising continuously removing and inserting substrates from said process chamber between said thermal evaporation processes while said process chamber is substantially at said first processing pressure.

21. The method of claim 19, wherein said thermal evaporation processes comprise a magnetron sputtering process or an electron beam source deposition process.

* * * * *